United States Patent
Cho et al.

(10) Patent No.: US 12,096,576 B2
(45) Date of Patent: Sep. 17, 2024

(54) FLEXIBLE DISPLAY DEVICE

(71) Applicant: LG DISPLAY CO., LTD., Seoul (KR)

(72) Inventors: SeokHyo Cho, Goyang-si (KR); JaeHo Kim, Goyang-si (KR); DoYoung Song, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 126 days.

(21) Appl. No.: 17/962,166

(22) Filed: Oct. 7, 2022

(65) Prior Publication Data

US 2023/0209742 A1 Jun. 29, 2023

(30) Foreign Application Priority Data

Dec. 23, 2021 (KR) ........................ 10-2021-0186564
May 19, 2022 (KR) ........................ 10-2022-0061380

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ................ G06F 1/1652; H05K 5/0217; G02F 1/133308
See application file for complete search history.

(56) References Cited

U.S. PATENT DOCUMENTS

| | | | | |
|---|---|---|---|---|
| 9,830,839 B2 * | 11/2017 | Song | ........................ | H04N 5/64 |
| 11,567,546 B2 * | 1/2023 | Kim | ...................... | G06F 1/1605 |
| 11,749,138 B2 * | 9/2023 | Park | ........................ | G09F 9/301 |
| | | | | 361/679.01 |
| 11,805,610 B2 * | 10/2023 | Pyo | ....................... | H05K 5/0217 |
| 2013/0207946 A1 | 8/2013 | Kim et al. | | |
| 2015/0185761 A1 * | 7/2015 | Song | ......................... | H04N 5/64 |
| | | | | 361/679.21 |
| 2015/0223358 A1 * | 8/2015 | Nam | ...................... | G06F 1/1652 |
| | | | | 74/102 |
| 2015/0296641 A1 * | 10/2015 | Song | .................... | H05K 5/0217 |
| | | | | 361/679.01 |
| 2016/0127674 A1 * | 5/2016 | Kim | ................. | H04N 21/42204 |
| | | | | 348/739 |
| 2016/0252236 A1 * | 9/2016 | Chen | .................... | H05K 5/0217 |
| | | | | 362/97.1 |

(Continued)

FOREIGN PATENT DOCUMENTS

| KR | 10-2013-0092868 A | 8/2013 |
|---|---|---|
| KR | 10-2013-0117110 A | 10/2013 |

(Continued)

*Primary Examiner* — Sagar Shrestha (74) *Attorney, Agent, or Firm* — Birch, Stewart, Kolasch & Birch, LLP (57) ABSTRACT

A flexible display device can include a back cover supporting a rear surface of a display panel, a first plate disposed on the rear surface of the back cover, and a second plate disposed on the rear surface of the back cover, the first plate and the second plate being configured to support the rear surface of the back cover and to slide in a lateral direction, and a lever assembly rotatably coupled to a central portion of the rear surface of the back cover and connected to the first plate and the second plate. A rotation of the lever assembly can cause the back cover to bend by sliding the first plate and the second plate in the lateral direction.

16 Claims, 11 Drawing Sheets

(56) References Cited

U.S. PATENT DOCUMENTS

| | | | |
|---|---|---|---|
| 2016/0353584 A1 | 12/2016 | Cho et al. | |
| 2016/0353594 A1* | 12/2016 | Cho | F16M 11/08 |
| 2017/0188470 A1* | 6/2017 | Cho | G09F 9/301 |
| 2017/0193863 A1* | 7/2017 | Cho | G06F 1/16 |
| 2018/0226001 A1* | 8/2018 | Chen | G09F 19/02 |
| 2020/0075886 A1 | 3/2020 | Kim et al. | |
| 2022/0201883 A1* | 6/2022 | Cho | H05K 5/0226 |
| 2023/0072005 A1 | 3/2023 | Oh | |
| 2023/0195406 A1* | 6/2023 | Cho | G09F 9/301 |
| | | | 381/152 |

FOREIGN PATENT DOCUMENTS

| | | |
|---|---|---|
| KR | 10-2014-0067535 A | 6/2014 |
| KR | 10-1399209 B1 | 6/2014 |
| KR | 10-2014-0105148 A | 9/2014 |
| KR | 10-2015-0136429 A | 12/2015 |
| KR | 10-2016-0141009 A | 12/2016 |
| KR | 10-2017-0080732 A | 7/2017 |
| KR | 10-2019-0003209 A | 1/2019 |
| KR | 10-2020-0025900 A | 3/2020 |
| KR | 10-2021-0101022 A | 8/2021 |

\* cited by examiner

FLEXIBLE DISPLAY DEVICE

CROSS REFERENCE TO RELATED APPLICATIONS

This application claims the priority benefit of Korean Patent Application No. 10-2021-0186564, filed on Dec. 23, 2021 in the Republic of Korea, and Korean Patent Application No. 10-2022-0061380, filed on May 19, 2022 in the Republic of Korea, the entire contents of all these applications being hereby expressly incorporated herein by reference into the present application.

BACKGROUND

Field of the Disclosure

Embodiments of the present disclosure relate to a flexible display device.

Description of the Related Art

In general, a liquid crystal display (LCD) device, a plasma display device, a field emission display device, and a light emitting display device, and so on are under active study as flat display devices.

Among them, the LCD device and the light emitting display device have attracted much interest due to their benefits of mass production, ease of driving means, and realization of high image quality.

Recently, in addition to the research and development of technical disadvantages of these flat display devices, the need for research and development (R&D) is particularly highlighted in terms of the structure of flexible display devices, such as curved and rolling types that can appeal to users more.

However, such a flexible display device has a structure in which a mechanism for changing the curvature needs to be coupled to the rear surface of the display panel in order to change the curvature of the display panel. Therefore, there can be a difficulty in realizing a constant curvature from the central portion of the display panel to both ends of the display panel due to the limitation of the coupling mechanism.

In addition, it can be difficult to continuously maintain the changed curvature while rapidly changing the curvature of the display panel to various curvatures desired by the user. Accordingly, there can be a limitation in that it can be difficult to accommodate the various needs of users.

Therefore, there is a need for research to address the above-mentioned limitations and other issues associated with the related art.

SUMMARY OF THE DISCLOSURE

Embodiments of the present disclosure provide a flexible display device in which a user can arbitrarily change the curvature into a flat display mode and a curved display mode.

Further, embodiments of the present disclosure provide a flexible display device capable of accommodating various needs of a user by being able to easily implement a desired curvature from a central portion of a display panel to both ends of a display panel irrespective of its size in the display device.

The objects of the embodiments of the present disclosure are not limited to what have been described above, and those skilled in the art will clearly understand other objects not mentioned herein from the following description.

According to an aspect, embodiments of the present disclosure provide a flexible display device including a back cover supporting a rear surface of a display panel, a first plate and a second plate respectively disposed on left and right sides (e.g., lateral sides) of a central portion of a rear surface of the back cover to support the rear surface of the back cover and slide, and a lever assembly rotatably coupled to a central portion of the rear surface of the back cover and connected to the first plate and the second plate to bend the back cover by sliding the first plate and the second plate in left and right directions.

According to embodiments of the present disclosure, there can be provided a flexible display device in which a user can arbitrarily change the curvature into a flat display mode and a curved display mode.

According to embodiments of the present disclosure, there can be provided a flexible display device capable of accommodating various needs of a user by being able to easily implement a desired curvature from a central portion of a display panel to both ends of a display panel irrespective of its size in the display device.

Further scope of applicability of the invention will become apparent from the detailed description given hereinafter. However, it should be understood that the detailed description and specific examples, while indicating embodiments of the invention, are given by way of illustration only, since various changes and modifications within the scope of the invention will become apparent to those skilled in the art from this detailed description.

BRIEF DESCRIPTION OF THE DRAWINGS

The above and other aspects, features and advantages of the present disclosure will be more apparent from the following detailed description taken in conjunction with the accompanying drawings.

DETAILED DESCRIPTION OF THE EMBODIMENTS

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Figure 1:
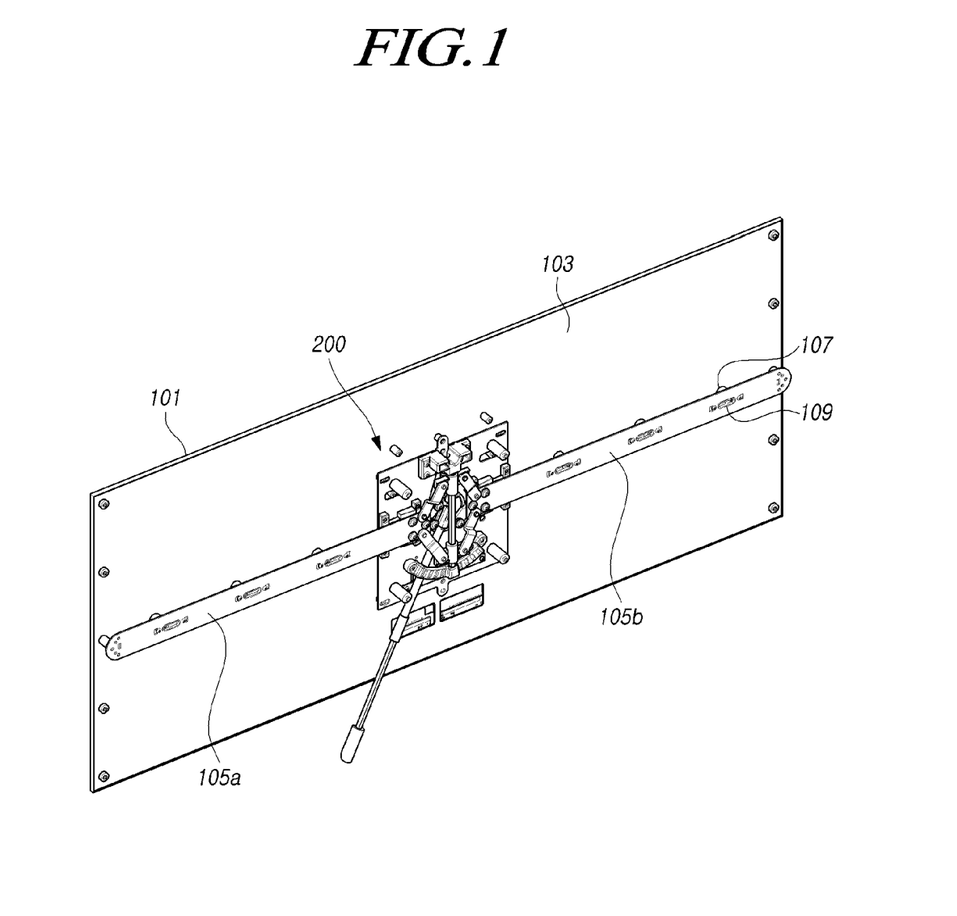
FIG. 1 is a perspective view showing a flexible display device according to embodiments of the present disclosure.
Figure 2:
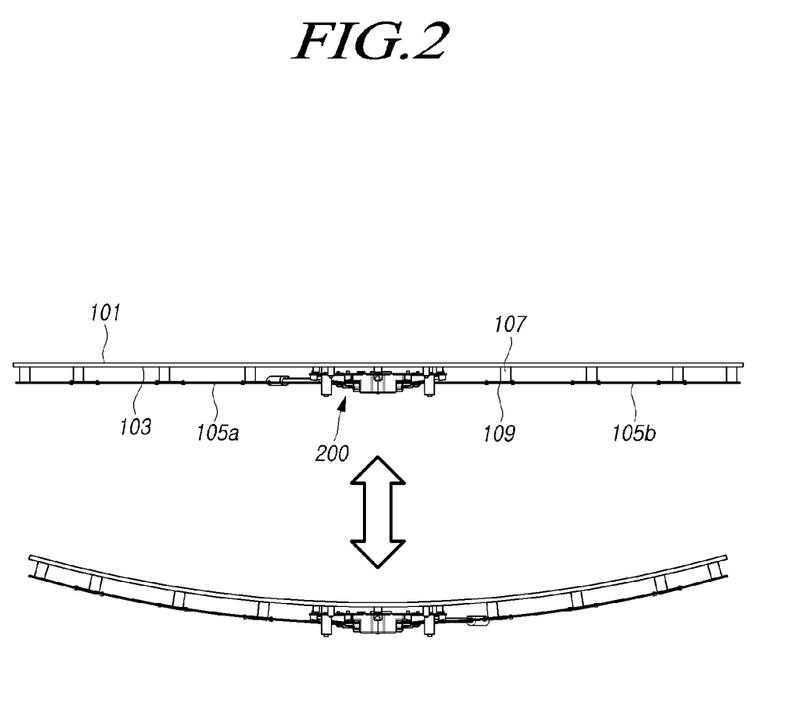
FIG. 2 is a plan view showing a flexible display device according to embodiments of the present disclosure.
Figure 3:
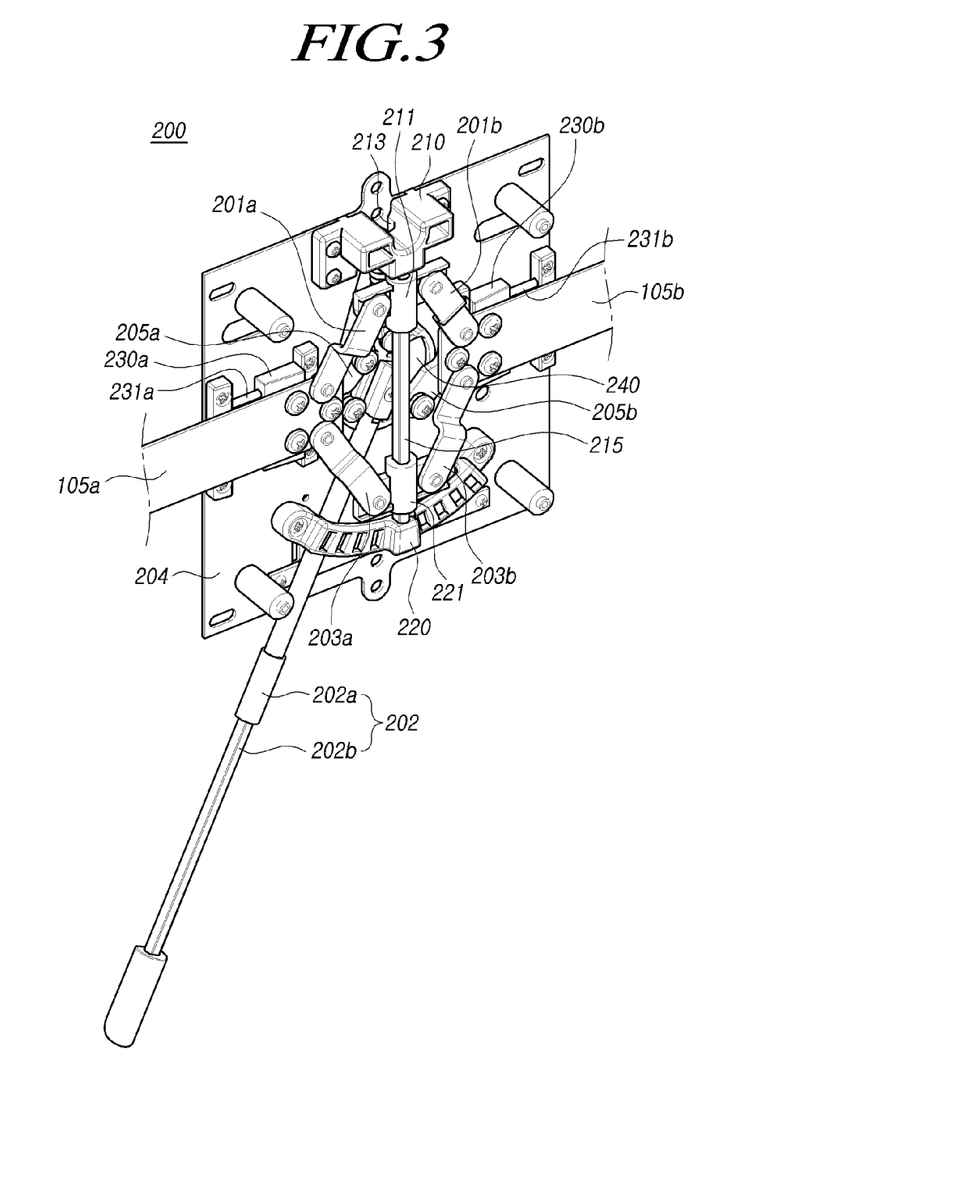
FIGS. 3 to 7 are perspective views showing a flexible display device according to embodiments of the present disclosure.
Figure 4:
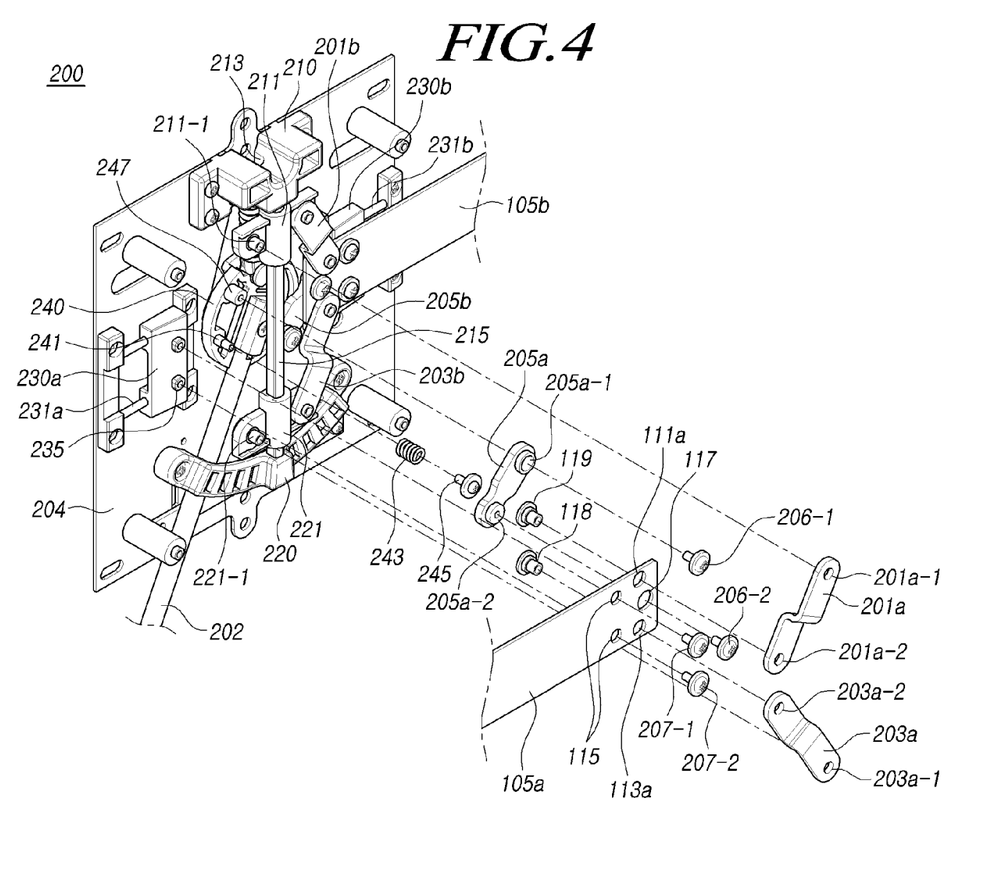
Figure 5:
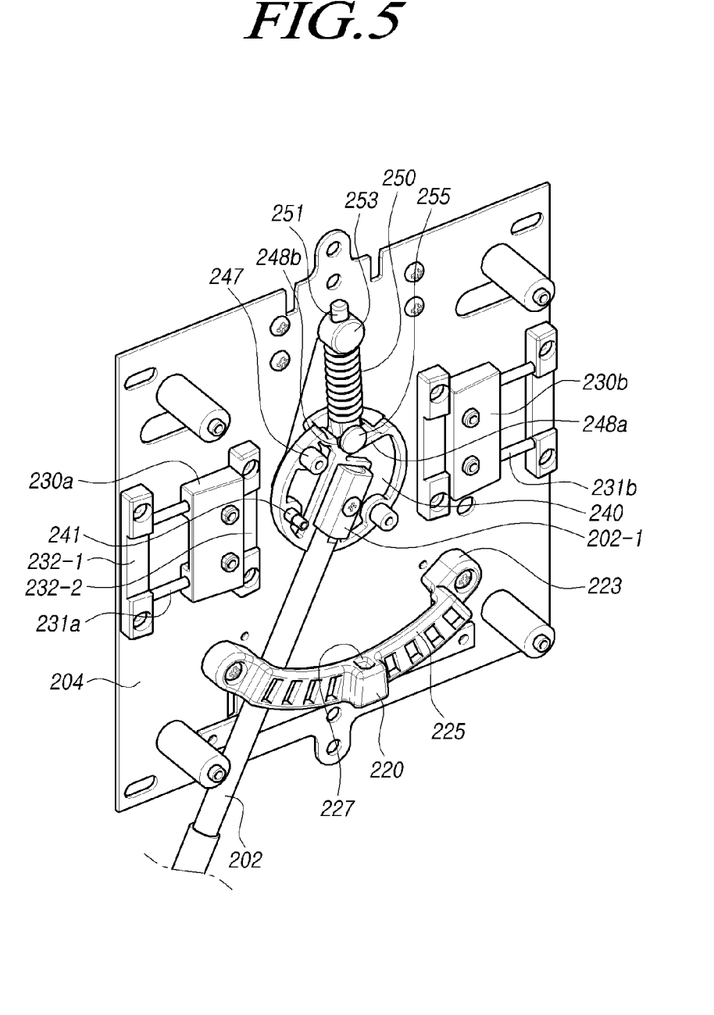
Figure 8:
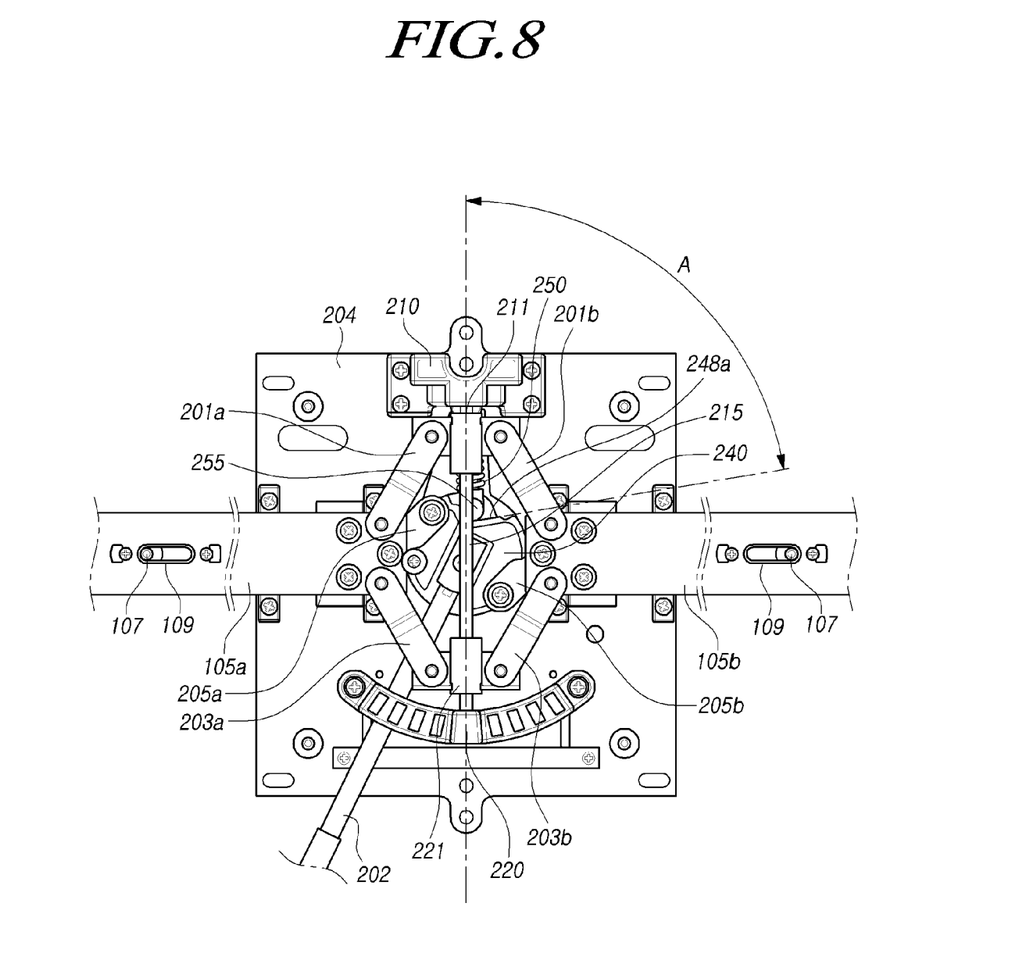
FIGS. 8 and 9 are rear views showing a flat mode and a curved mode of a flexible display device according to embodiments of the present disclosure.
Figure 9:
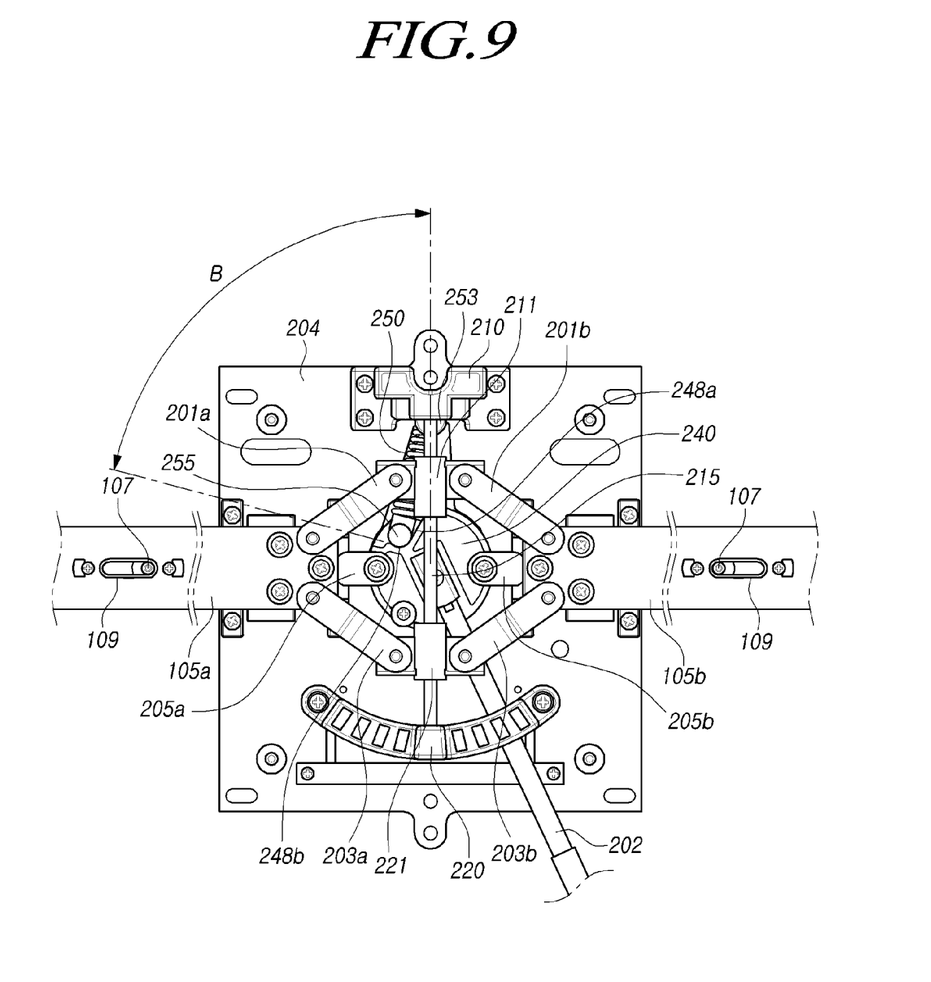
Figure 10:
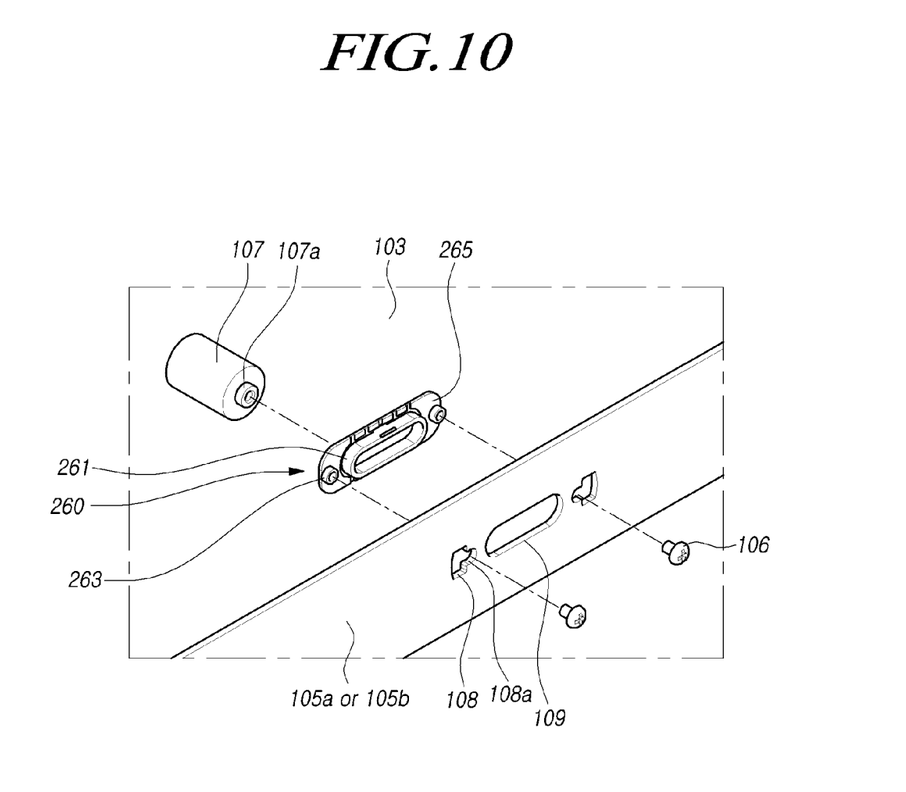
FIG. 10 is a perspective view showing a flexible display device according to embodiments of the present disclosure.
Figure 11:
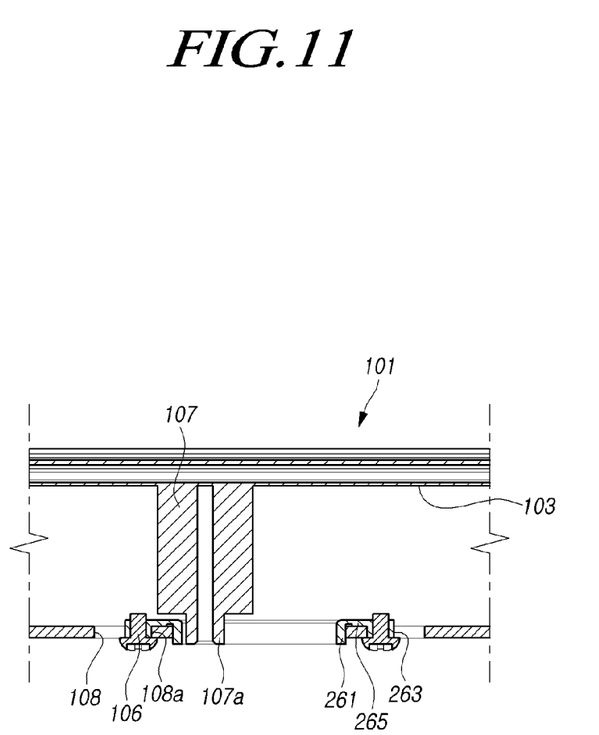
FIG. 11 is a sectional view showing a flexible display device according to embodiments of the present disclosure.

FIG. 1 is a perspective view showing a flexible display device according to embodiments of the present disclosure, FIG. 2 is a plan view showing a flexible display device according to embodiments of the present disclosure, FIGS. 3 to 7 are perspective views showing a flexible display device according to embodiments of the present disclosure, FIGS. 8 and 9 are rear views showing a flat mode and a curved mode of a flexible display device according to embodiments of the present disclosure, FIG. 10 is a perspective view showing a flexible display device according to embodiments of the present disclosure, and FIG. 11 is a sectional view showing a flexible display device according to embodiments of the present disclosure. All the components of each flexible display device according to all embodiments of the present disclosure are operatively coupled and configured.

As illustrated in FIGS. 1 to 11, a flexible display device according to one or more embodiments of the present disclosure can include a back cover 103 supporting a rear surface of a display panel 101, a first plate 105a and a second plate 105b respectively disposed on left and right sides (e.g., lateral sides) of a central portion of a rear surface of the back cover 103 to support the rear surface of the back cover 103 and slide, and a lever assembly 200 rotatably coupled to a central portion of the rear surface of the back cover 103 and connected to the first plate 105s and the second plate 105b to bend the back cover 103 by sliding the first plate 105a and the second plate 105b in left and right directions.

First, in embodiments of the present disclosure, the reference of the direction is described in the display panel 101 side as a front side and the back cover 103 side as a rear side. And, as shown in FIG. 1, the reference of the direction will be described in the left and right, up and down directions in the direction facing the back cover 103.

In addition, two or more of the first plate 105a and the second plate 105b disposed on the left and right sides (e.g., lateral sides) of the back cover 103 can be provided, respectively, but in embodiments of the present disclosure, the first plate 105a and the second plate 105b are each provided one by one as an example.

And, the lever assembly 200 provided in the central portion of the rear surface of the back cover 103 can be directly coupled to the rear surface of the back cover 103 or can be coupled to the rear surface of the back cover 103 via a separate module plate 204. In embodiments of the present disclosure, a description will be made based on a case in which the lever assembly 200 is coupled to the rear surface of the module plate 204 coupled to the back cover 103.

In embodiments of the present disclosure, the display panel 101 is coupled to the front of the back cover 103, and the display panel 101 can be applied regardless of a liquid crystal display panel or a light emitting display panel.

For example, when the display panel 101 is configured as an LCD panel, the display panel can further include a backlight unit irradiating light onto the LCD panel, a lower polarization plate attached to a lower substrate, and an upper polarization plate attached to the front surface of an upper substrate. The specific configurations of the lower substrate and the upper substrate can be formed in various manners known to those skilled in the art according to, for example, twisted nematic (TN) mode, vertical alignment (VA) mode, in plane switching (IPS) mode, and fringe field switching (FFS) mode.

When the display panel 101 is configured as a light emitting display panel, the light emitting display panel can include a lower substrate in which a plurality of light emitting cells are formed in respective areas defined by gate lines, data lines, and power (VDD) lines, and an upper substrate face to face bonded to the lower substrate. This configuration is well-known in the art to which the present disclosure is relevant, and thus related drawings and detailed description are not provided herein.

As such, the display panel 101 can be used irrespective of its type in embodiments of the present disclosure. Accordingly, the following description is given irrespective of the type of a display panel.

As shown in FIG. 2, when changing the curvature of the display panel 101 in embodiments of the present disclosure, the radius of curvature is variously set in the curved mode and the flat mode. For example, the lever assembly 200 bends the back cover 103 while sliding the first plate 105a and the second plate 105b to the left and right, respectively, at the center of the rear surface of the back cover 103.

Here, the first plate 105a and the second plate 105b are formed of a metal material, such as an aluminum alloy or stainless steel having high rigidity, to bend the display panel 101 and the back cover 103. Accordingly, the first plate 105a and the second plate 105b are elastically deformed and restored to a predetermined curvature.

As an example, in embodiments of the present disclosure, the radius of curvature R of the display panel 101 and the back cover 103 can be bent to approximately 700~1000 mm.

In the planar mode, the center of curvature of the display panel 101 is positioned on a plane parallel to the display panel 101 as shown in FIG. 1 and the upper part of FIG. 2. In the curved mode, the center point of curvature of the display panel 101 is located at the front side of the display panel 101, as shown in the lower part of FIG. 2.

In addition, the lever 202 is mounted so that the curvature of the display panel 101 can be more easily changed, so that the user can change the curvature of the display panel 101 by rotating the lever 202. The lever 202 can have an inner lever 202b inserted into the tube-shaped outer lever 202a so that the entire length of the lever 202 can be adjusted for the convenience of the user.

In addition, slot holes 109 are provided in the left and right directions of the back cover 103 in the first plate 105a and the second plate 105b. A plurality of fixing members 107 are provided on the rear surface of the back cover 103, each fixing member 107 being provided at a position corresponding to a respective one of the slot holes 109.

Accordingly, when the first plate 105a and the second plate 105b slide in the left and right directions of the back cover 103, each fixing member 107 is supported by the respective slot hole 109 and slides the corresponding direction, and this sliding can cover the length change in the left and right directions due to the bending of the back cover 103. Then, the sliding of the first plate 105a and the second plate 105b absorbs the length change in the left and right directions due to the bending of the back cover 103.

The lever assembly 200 can include a module plate 204 fixed to the central portion of the rear surface of the back cover 103, a rotator 240 rotatably coupled to the module plate 204 and having a lever 202 coupled thereto, a first rotator link 205a having one end (e.g., a first end) rotatably coupled to the rotator 240 and another end (e.g., a second end) rotatably coupled to the first plate 105a, and a second rotator link 205b having one end (e.g., a first end) rotatably coupled to the rotator 240 and another end (e.g., a second end) rotatably coupled to the second plate 105b.

A coupling hole 205a-1 of the first rotator link 205a is rotatably coupled to a fixing portion 247 formed on one side of the rear surface of the rotator 240 by a coupling member 206-1. A coupling hole 205a-2 of the first rotator link 205a is rotatably coupled to a coupling hole 117 of the first plate 105a by a coupling member 206-2.

The module plate 204 forms a module in an integral state in which the lever assembly 200 is coupled, and is coupled to the rear surface of the back cover 103.

However, as described above, in embodiments of the present disclosure, the lever assembly 200 can be directly coupled to the rear surface of the back cover 103 without being coupled to the module plate 204.

The rotator 240 has an approximately disk shape, and the central portion of the front surface is coupled with the module plate 204 and the hinge 244 so that it can be rotatably coupled to the module plate 204, and the central portion of the rear surface is coupled to the lever 202 by a lever coupling member 202-1.

And, one side of the rotator 240 is rotatably coupled to the first plate 105a by a first rotator link 205a and the other side of the rotator 240 is rotatably coupled to the second plate 105b by a second rotator link 205b.

Accordingly, when the user operates the lever 202, the first rotator link 205a slides the first plate 105a to the left while the rotator 240 rotates the hinge 244 as an axis, and the second rotator link 205b slides the second plate 105b to the right.

The lever assembly 200 can include a vertical guide 215 disposed in a vertical direction of the module plate 204 (e.g., perpendicular to extension directions of the first plate 105a and the second plate 105b), vertical sliders 211 and 221 sliding up and down along the vertical guide 215, first slider links 201a and 203a having one end (e.g., a first end) rotatably coupled to the vertical sliders 211, 221 and another end (e.g., a second end) rotatably coupled to the first plate 105a, and a second slider link 201b, 203b having one end (e.g., a first end) rotatably coupled to the vertical slider 211, 221 and another end (e.g., a second end) rotatably coupled to the second plate 105b.

Accordingly, when the user operates the lever 202, the first rotator link 205a pushes and slides the first plate 105a to the left, and the first slider link 201a and 203a moves the first plate 105a and slide together. At the same time, the first slider link 201a and 203a are supported while moving the vertical slider 211 and 221 up and down, so that the first plate 105a is supported in the left-right and up-down directions to achieve stable sliding.

In addition, while simultaneously sliding the second slider link 201b and 203b together with the second plate 105b, the vertical slider 211 and 221 is supported while moving up and down. Then the second plate 105b is stably slid while being supported in the left and right directions and the vertical direction.

Here, the vertical slider 211 and 221 can include an upper vertical slider 211 and a lower vertical slider 221 disposed above and below the vertical guide 215.

Additionally, the first slider link 201a and 203a can include a first upper slider link 201a having one end (e.g., a first end) rotatably coupled to the upper vertical slider 211 and another end (e.g., a second end) rotatably coupled to the first plate 105a, and a first lower slider link 203a having one end rotatably coupled to the lower vertical slider 221 and another end (e.g., a second end) rotatably coupled to the first plate 105a.

A coupling hole 201a-2 of the first upper slider link 201a is rotatably coupled to a coupling hole 111a of an upper side of one end (e.g., a first end) of the first plate 105a by a coupling member 119, a coupling hole 201a-1 of the first upper slider link 201a is rotatably coupled to the upper vertical slider 211 by a coupling member 211-1.

A coupling hole 203a-2 of the first lower slider link 203a is rotatably coupled to a coupling hole 113a of a lower side of one end (e.g., a first end) of the first plate 105a by a coupling member 118, a coupling hole 203a-1 of the first lower slider link 203a is rotatably coupled to the lower vertical slider 221 by a coupling member 221-1.

For example, the first upper slider link 201a is coupled to an upper portion of one end (e.g., a first end) of the first plate 105a and the first lower slider link 203a is coupled to a lower portion of the upper vertical slider 211, and slides the upper vertical slider 211 and the lower vertical slider 221 up and down. Therefore, the force for sliding the first plate 105a is transmitted symmetrically in the left and right directions and in the vertical direction, so that the sliding of the first plate 105a is made stably without being biased to either side.

The second slider links 201b and 203b can include a second upper slider link 201b having one end (e.g., a first end) rotatably coupled to the upper vertical slider 211 and another end rotatably coupled to the second plate 105b, and a second lower slider link 203b having one end (e.g., a first end) rotatably coupled to the lower vertical slider 221 and another end (e.g., a second end) rotatably coupled to the second plate 105b.

For example, the second upper slider link 201b is coupled to an upper portion of one end (e.g., a first end) of the second plate 105b and the second lower slider link 203b is coupled to a lower portion of the upper vertical slider 211, and slides the upper vertical slider 211 and the lower vertical slider 221 up and down. Therefore, the sliding force of the second plate 105b is transmitted symmetrically in the left and right directions and in the vertical direction, so that the sliding of the second plate 105b is made stably without being biased to either side.

Accordingly, both the left and right sliding of the first plate 105a and the second plate 105b are made stably.

Meanwhile, the lever assembly 200 can include a rotator guide 241a and 241 that passes through the module plate 204 and is coupled to the rotator 240 to guide the rotation angle of the rotator 240.

The module plate 204 is provided with a guide groove 204b cut in a circumferential direction, and one or more guide protrusions 204c protruding inward to become narrower in width can be provided on an inner surface of the guide groove 204b. The guide groove 204b can be engaged by the rotator guide 241a, 241. For example, the rotator guide 241a, 241 is movable within the guide groove 204b.

For example, by setting the rotation angle of the rotator 240 in advance to several sections and forming the guide protrusions 204c between the set angles so that the user can easily stop at a set angle when the lever 202 is rotated.

Figure 6:
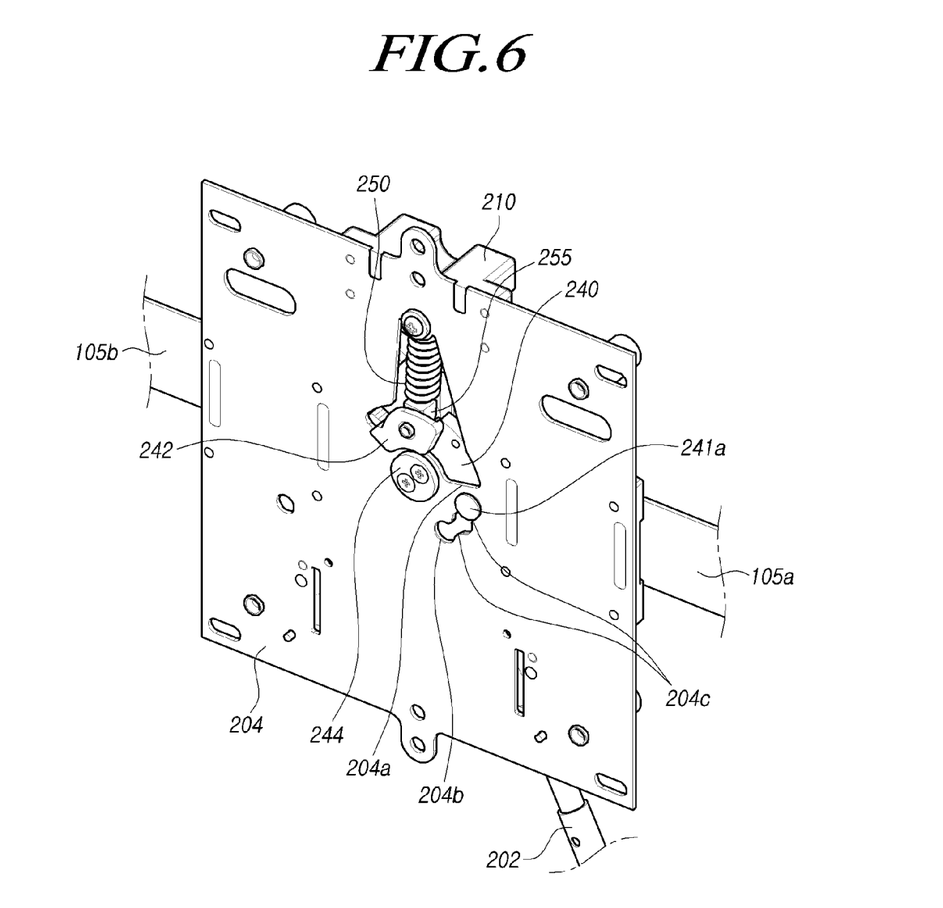
Figure 7:
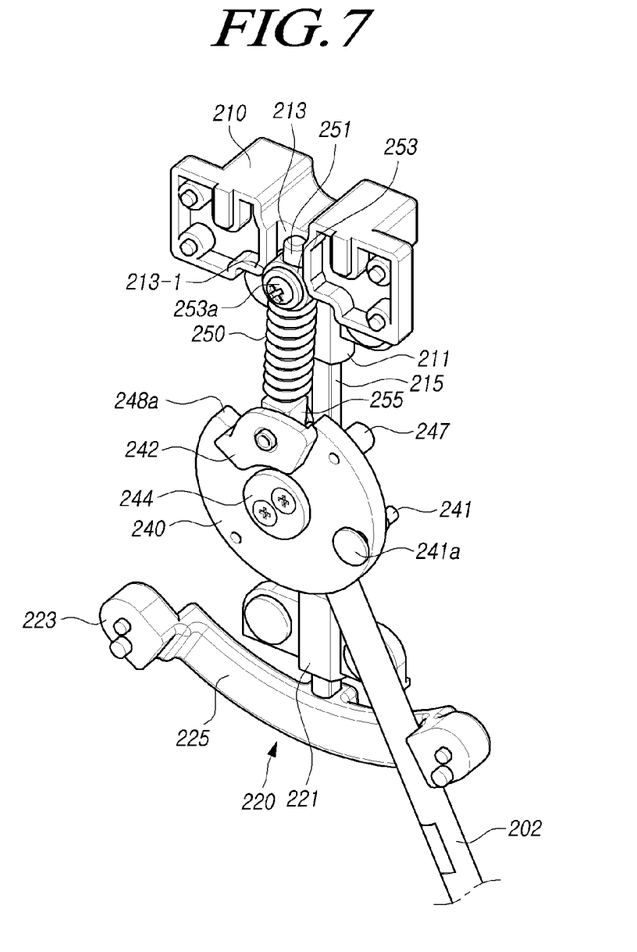

And, as an example in FIG. 6, the guide protrusions 204c are formed in two places so that a planar mode, a maximum curved mode, and an intermediate curved mode can be implemented, for example, the rotation of the rotator 240 can be stopped at three places.

The rotator guide 241a and 241 configured to have a head 241a supported on the front surface of the module plate 204 and a body 241 through the guide groove 204b to be coupled through the rotator 240. An elastic support member 243 is coupled between a fixing member 245 coupled to the body 241 and a rear surface of the rotator 240.

Accordingly, the elastic support member 243 absorbs vibration and noise generated when the rotator guides 241a and 241 pass through the guide protrusion 204c while moving in the circumferential direction along the guide groove 204b. And the elastic support member 243 provides an elastic restoring force so that the rotator guide 241a and 241 can be restored to its original position while moving in the front-rear direction of the module plate 204.

In addition, the lever assembly 200 can include a first horizontal guide 231a disposed in the left and right direction between the first plate 105a and the module plate 204, and a first horizontal slider 230a coupled to the first plate 105a and sliding left and right along the first horizontal guide 231a.

The first horizontal guide 231a can be provided as a pair disposed up and down, and both ends of the first horizontal guide 231a are supported and fixed to the guide support member 232-1 and 232-2 fixed to the module plate 204.

A fixing portion 235 of the first horizontal slider 230a is coupled to a coupling hole 115 formed in the first plate 105a by a coupling member 207-1 and 207-2.

In addition, the lever assembly 200 can include a second horizontal guide 231b disposed in a left and right direction between the second plate 105b and the module plate 204, and a second horizontal slider 230b coupled to the second plate 105b and sliding left and right along the second horizontal guide 231b.

For example, when the first plate 105a slides, the first plate 105a slides left and right together with the first horizontal slider 230a. At the same time, when the second plate 105b slides, the second plate 105b slides left and right together with the second horizontal slider 230b. Accordingly, the first plate 105a and the second plate 105b are stably slide left and right.

In addition, the lever assembly 200 can include an upper guide fixing member 210 that supports the upper end of the vertical guide 215 and is fixed to the upper portion of the module plate 204, and a lower guide fixing member 220 that supports the lower end of the vertical guide 215 and is fixed to the lower portion of the module plate 204.

The upper guide fixing member 210 has an insertion hole formed on the lower side thereof, the upper end of the vertical guide 215 is inserted and supported, and is fixed to the module plate 204. The lower guide fixing member 220 has an insertion hole 227 into which the lower end of the vertical guide 215 is inserted, and limits the left and right operating angles of the lever 202 and is fixed to the module plate 204.

In addition, the lever assembly 200 can include a rotator supporting member 251 having one end (e.g., a first end) rotatably supported by the upper guide fixing member 210 and another end (e.g., a second end) supported by the rotator 240, and an elastic member 250 having one end (e.g., a first end) supported by the upper guide fixing member 210 and another end (e.g., a second end) elastically supporting another end (e.g., a second end) of the rotator support member 251 downward.

One end (e.g., a first end) of the rotator supporting member 251 is coupled through a rotation support member 253 so that the rotation support member 253 is rotationally supported by the upper guide fixing member 210. The other end 255 of the rotator supporting member 251 supports the rotator 240 in the downward direction.

And, the elastic member 250 fitted to the outer peripheral side of the rotator support member 251 is coupled while being elastically supported by a support end 255 formed to be stepped on the other end of the rotator supporting member 251 and the rotation support member 253. Then, the rotator 240 is supported downward by the elastic member 250.

Therefore, when the rotator 240 is rotated by the user's manipulation of the lever 202, the rotator 240 is prevented from flowing up, down, left and right. And when changing from the curved mode to the flat mode, excessive rotational force caused by the elastic restoring force of the back cover 103 is buffered.

A tightening member 253a passes through the rotation support member 253 to support the outer peripheral surface of one end (e.g., a first end) of the rotator supporting member 251 and is coupled. Therefore, the user can adjust the amount of fastening of the tightening member 253a and adjust the buffering force of the elastic member 250.

A front surface of the upper guide fixing member 210 is provided with an opening hole 213 opened in the vertical direction so as to form a space between the module plate 204, one end (e.g., a first end) of the rotator supporting member 251 is disposed inside the opening hole 213. A lower end of the opening hole 213 is provided with a curved groove 213-1 for supporting the outer peripheral surface of the rotation support member 253.

The rotator 240 is provided with a support groove 248a and 248b which is recessed inward from an outer circumferential surface and into which an end (e.g., first end) of the rotator supporting member 251 is inserted and supported.

The support groove 248a and 248b is formed by connecting a first support groove 248a and a second support groove 248b in a curved surface. The other end (e.g., second end)

of the rotator supporting member 251 is supported by the first support groove 248a in the planar mode, and is supported by the second support groove 248b in the curved mode.

For example, the first support groove 248a and the second support groove 248b are formed such that the other end (e.g., second end) of the rotator supporting member 251 is disposed at positions deviated by a predetermined angle from the vertical axis in the flat mode and the curved mode state.

Referring to FIG. 8 showing a planar mode state, the first support groove 248a is formed in a plane with an acute angle "A" to the right from the vertical axis, so that a moment force in the clockwise direction is generated to prevent the rotator 240 from rotating in the counterclockwise direction.

And, referring to FIG. 9 showing the curved mode state, the second support groove 248b is formed in a plane with an acute angle "B" to the left from the vertical axis, so that a moment force in the counterclockwise direction is generated to prevent the rotator 240 from rotating in the clockwise direction.

Here, the angles "A" and "B" are formed at an angle of approximately 70° to 80°.

Accordingly, due to the first support groove 248a and the second support groove 248b, the rotator 240 can be maintained in a stopped state without rotating in the flat mode and the curved mode.

In addition, the lower guide fixing member 220 can include a fixed end 223 provided on both sides of the lower guide fixing member 220 and fixed to the module plate 204, and a connection portion 225 bent backwardly from the fixed end 223 and connected thereto and spaced apart from the module plate 204 and configured to have an operating space of the lever 202.

The lower guide fixing member 220 is formed in an approximately arc shape, and the fixing end 223 on both sides is fixed to the module plate 204 and an operating space of the lever 202 is formed as a space between the connection portion 225 and the module plate 204.

The connection portion 225 is provided with an insertion hole 227 into which the lower end of the vertical guide 215 is inserted.

A front surface of the rotator 240 is provided with a stopping protrusion 242 that protrudes forward and an end of the rotator supporting member 251 is rotatably coupled, the module plate 204 is provided with a stopping groove 204a in which the stopping protrusion 242 is inserted and one side and another side in the circumferential direction of the stopping protrusion 242 are supported by the stopping groove 204a when the rotator 240 rotates.

The stopping groove 204a provided in the module plate 204 is formed in a substantially sectoral shape. When the rotator 240 rotates, one side and the other side in the circumferential direction of the stopping protrusion 242 are supported by the stopping groove 204a and can be stopped.

In addition, embodiments of the present disclosure can include a sliding support member 260 inserted and fixed in slot holes 109. The sliding support member 260 is provided with a protruding support portion 261 supported by sliding a supporting end 107a of the fixing member 107.

In addition, the sliding support member 260 is provided with a plate support portion 265 supported on the front surface of the first plate 105a and the second plate 105b, and a protruding fixing portion 263 is provided at a position spaced apart from both ends of the protruding support portion 261. The first plate 105a and the second plate 105b are provided with cut-out holes 108 at positions spaced apart from both sides of slot holes 109, respectively, and the cut-out hole 108 is provided with a seating groove 108a in which the protruding fixing portion 263 is seated.

Therefore, when assembling the sliding support member 260, the assembly jig holding the sliding support member 260 is inserted into the slot holes 109 and the seating groove 108a while moving through the cut-out hole 108. And fast assembly is made while fastening the fastening member 106 to the protruding fixing portion 263 from the opposite side.

As described above, according to embodiments of the present disclosure, there can be provided a flexible display device in which a user can arbitrarily change the curvature into a flat display mode and a curved display mode.

Further, according to embodiments of the present disclosure, there can be provided a flexible display device capable of accommodating various needs of a user by being able to easily implement a desired curvature from a central portion of a display panel to both ends of a display panel irrespective of its size in the display device.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

Various embodiments described herein may be implemented in a computer-readable medium using, for example, software, hardware, or some combination thereof. For example, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, other electronic units designed to perform the functions described herein, or a selective combination thereof. In some cases, such embodiments are implemented by the controller. For Example, the controller is a hardware-embedded processor executing the appropriate algorithms (e.g., flowcharts) for performing the described functions and thus has sufficient structure. Also, the embodiments such as procedures and functions may be implemented together with separate software modules each of which performs at least one of functions and operations. The software codes can be implemented with a software application written in any suitable programming language. Also, the software codes can be stored in the memory and executed by the controller, thus making the controller a type of special purpose controller specifically configured to carry out the described functions and algorithms. Thus, the components shown in the drawings have sufficient structure to implement the appropriate algorithms for performing the described functions.

What is claimed is:

1. A flexible display device comprising:
   a back cover supporting a rear surface of a display panel and including a rear surface;
   a first plate disposed on the rear surface of the back cover;
   a second plate disposed on the rear surface of the back cover, the first plate and the second plate being configured to support the rear surface of the back cover and to slide in a lateral direction; and
   a lever assembly rotatably coupled to a central portion of the rear surface of the back cover and connected to the first plate and the second plate,
   wherein a rotation of the lever assembly causes the back cover to bend by sliding the first plate and the second plate in the lateral direction, and
   wherein the lever assembly comprises:
      a module plate fixed to the central portion of the rear surface of the back cover;
      a rotator rotatably coupled to the module plate and having a lever coupled thereto;
      a first rotator link having a first end rotatably coupled to the rotator and a second end rotatably coupled to the first plate;
      a second rotator link having a first end rotatably coupled to the rotator and a second end rotatably coupled to the second plate;
      a first horizontal guide disposed between the first plate and the module plate; and
      a first horizontal slider coupled to the first plate and sliding along the first horizontal guide in the lateral direction.

2. The flexible display device of claim 1, wherein each of the first plate and the second plate is provided with slot holes elongated in the lateral direction, and
   wherein the back cover includes fixing members provided at positions corresponding to the slot holes, so that when the back cover is bent due to the rotation of the lever, the fixing members are supported by the slot holes and slide about the slot holes.

3. The flexible display device of claim 1, wherein the lever assembly further comprises a rotator guide that passes through the module plate and is coupled to the rotator to guide a rotation angle of the rotator.

4. The flexible display device of claim 3, wherein the module plate includes:
   a guide groove cut in a circumferential direction; and
   a guide protrusion protruding inwardly on an inner surface of the guide groove.

5. The flexible display device of claim 1, wherein the lever assembly further comprises:
   a second horizontal guide disposed between the second plate and the module plate; and
   a second horizontal slider coupled to the second plate and sliding along the second horizontal guide in the lateral direction.

6. A flexible display device comprising:
   a back cover supporting a rear surface of a display panel and including a rear surface;
   a first plate disposed on the rear surface of the back cover;
   a second plate disposed on the rear surface of the back cover, the first plate and the second plate being configured to support the rear surface of the back cover and to slide in a lateral direction; and
   a lever assembly rotatably coupled to a central portion of the rear surface of the back cover and connected to the first plate and the second plate,
   wherein a rotation of the lever assembly causes the back cover to bend by sliding the first plate and the second plate in the lateral direction, and
   wherein the lever assembly comprises:
      a module plate fixed to the central portion of the rear surface of the back cover;
      a rotator rotatably coupled to the module plate and having a lever coupled thereto;
      a first rotator link having a first end rotatably coupled to the rotator and a second end rotatably coupled to the first plate;
      a second rotator link having a first end rotatably coupled to the rotator and a second end rotatably coupled to the second plate;
      a vertical guide disposed in a vertical direction of the module plate;
      a vertical slider sliding up and down along the vertical guide;
      a first slider link having a first end rotatably coupled to the vertical slider and a second end rotatably coupled to the first plate; and
      a second slider link having a first end rotatably coupled to the vertical slider and a second end rotatably coupled to the second plate.

7. The flexible display device of claim 6, wherein the vertical slider comprises:
   an upper vertical slider disposed on an upper portion of the vertical guide; and
   a lower vertical slider disposed on a lower portion of the vertical guide.

8. The flexible display device of claim 7, wherein the first slider link comprises:
   a first upper slider link including a first end rotatably coupled to the upper vertical slider and a second end rotatably coupled to the first plate; and
   a first lower slider link having a first end rotatably coupled to the lower vertical slider and a second end rotatably coupled to the first plate.

9. The flexible display device of claim 8, wherein the second slider link comprises:
   a second upper slider link including a first end rotatably coupled to the upper vertical slider and a second end rotatably coupled to the second plate; and
   a second lower slider link including a first end rotatably coupled to the lower vertical slider and a second end rotatably coupled to the second plate.

10. The flexible display device of claim 6, wherein the lever assembly further comprises:
    an upper guide fixing member supporting an upper end of the vertical guide and fixed to an upper portion of the module plate; and
    a lower guide fixing member supporting a lower end of the vertical guide and fixed to a lower portion of the module plate.

11. The flexible display device of claim 10, wherein the lever assembly further comprises:
    a rotator supporting member having a first end rotatably supported by the upper guide fixing member and a second end supported by the rotator; and
    an elastic member having a first end supported by the upper guide fixing member and another end a second end elastically supporting an end of the rotator supporting member downward.

12. The flexible display device of claim 11, wherein the rotator is provided with a supporting groove recessed inward from an outer circumferential surface to be supported by inserting an end of the rotator supporting member.

13. A flexible display device comprising:
a first plate;
a second plate spaced from the first plate, the first plate and the second plate being configured to support a rear surface of the flexible display device, and slide in a lateral direction;
a lever assembly rotatably coupled to the first plate and the second plate; and
a back cover supporting a display panel,
wherein a rotation of the lever assembly causes the flexible display device to bend by sliding the first plate and the second plate in the lateral direction, and
wherein the lever assembly comprises:
a module plate fixed to a rear surface of the back cover;
a rotator rotatably coupled to the module plate and having a lever coupled thereto;
a vertical guide disposed in a vertical direction of the module plate; and
a vertical slider sliding up and down along the vertical guide and vertically supporting the first plate and the second plate.

14. The flexible display device of claim 13, wherein the rotator is coupled to the first plate and to the second plate by links, so that a rotation of the lever causes a rotation of the rotator and sliding of the first plate and the second plate in the lateral direction.

15. The flexible display device of claim 14, wherein each of the first plate and the second plate is provided with slot holes, and
wherein the back cover includes fixing members provided at positions corresponding to the slot holes, the fixing members being supported by the slot holes and allowing the back cover to bend during sliding of the first plate and the second plate by the lever.

16. The flexible display device of claim 13, wherein the module plate is provided with a stopping groove, and
wherein a front surface of the rotator is provided with a stopping protrusion disposed within the stopping groove for limiting the rotation of the rotator.

* * * * *